United States Patent
Matsubara

(10) Patent No.: US 7,365,431 B2
(45) Date of Patent: Apr. 29, 2008

(54) SEMICONDUCTOR DEVICE HAVING MULTILAYER STRUCTURE AND METHOD FOR MANUFACTURING THEREOF

(75) Inventor: Yoshihisa Matsubara, Tsukuba-shi (JP)

(73) Assignee: NEC Electronics Corporation, Kanagawa (JP)

(*) Notice: Subject to any disclaimer, the term of this patent is extended or adjusted under 35 U.S.C. 154(b) by 313 days.

(21) Appl. No.: 11/002,269

(22) Filed: Dec. 3, 2004

(65) Prior Publication Data
US 2005/0179134 A1 Aug. 18, 2005

(30) Foreign Application Priority Data
Feb. 18, 2004 (JP) ............................ 2004-040830
Oct. 26, 2004 (JP) ............................ 2004-310773

(51) Int. Cl.
*H01L 23/48* (2006.01)
*H01L 31/00* (2006.01)
*C12P 17/16* (2006.01)
*C12P 35/08* (2006.01)

(52) U.S. Cl. ...................... 257/758; 257/776; 257/459; 435/118; 435/522; 438/89; 438/128

(58) Field of Classification Search ................ 257/758, 257/776, 459; 435/118, 622, 48, 552; 438/26, 438/89, 128
See application file for complete search history.

(56) References Cited

U.S. PATENT DOCUMENTS 6,207,479 B1  3/2001  Liew et al.
6,262,487 B1  7/2001  Igarashi et al.
6,546,540 B1  4/2003  Igarashi et al.

FOREIGN PATENT DOCUMENTS

JP           9-148444       6/1997
JP           2003-60174     2/2003

*Primary Examiner*—Howard Weiss
*Assistant Examiner*—Steven H Rao
(74) *Attorney, Agent, or Firm*—Leydig, Voit & Mayer, Ltd.

(57) ABSTRACT

A semiconductor device having a first wiring layer including first wirings on a substrate, a contact layer on the first wiring layer and including contacts connected to the first wirings, and a second wiring layer on the contact layer and including second wirings connected to the contacts. Contact pitch is larger than the minimum wiring pitch of the first wirings or the minimum wiring pitch of the second wirings.

14 Claims, 10 Drawing Sheets

SEMICONDUCTOR DEVICE HAVING MULTILAYER STRUCTURE AND METHOD FOR MANUFACTURING THEREOF

FIELD OF THE INVENTION

The present invention relates to a semiconductor device and to a method for manufacturing there of. More particularly, the present invention relates to a semiconductor device having a multilayer structure including stacked wiring layers and contacts which connect the wiring layers, and to a method for manufacturing thereof.

DESCRIPTION OF THE BACKGROUND ART

In recent years, with the development of semiconductor devices improved in multifunctionality and packaging density, a multilayer wiring structure in which a plurality of wiring layers are vertically stacked has found great use. In most cases of forming contacts used for connection of stacked wiring layers or the like, holes for wiring or contacts are formed in an interlayer dielectric film based on a design rule for the multilayer wiring structure, and conductive members or the like are embedded in the holes to form the contacts. In other cases, a film of a material used for wiring and for some other purpose is formed, and this wiring material film is etched to form the desired wiring.

Various patterns relating to such wiring layout have been designed from the viewpoint of efficiency, space saving and so on.

An example of a semiconductor device wiring structure such as a gate array type of structure for a general-purpose design will be described with reference to FIG. 13. In this structure, a wiring of a large width for stronger power supply, called a power supply ring (or a power ring) 40, exists outside a macrocell. Signal wiring, power supply wiring and ground wiring are placed in the macrocell inside the power supply ring 40. First wirings 41 in a lower layer and second wirings 42 in an upper layer perpendicular to each other are connected through vias 43. To increase the degree of design freedom with priority, this structure is designed so that the wirings 41 and 42 in the wiring layers are placed on a square grid uniform in each of X- and Y-directions (indicated by dotted lines in FIG. 13). That is, the wiring pitch and the via pitch can take the same minimum value.

If wirings and vias are placed on a square grid, the influence of a change in direction of the wirings on designing is small and a process check pattern can be formed without considering the direction of the wirings. Consequently, the number of kinds of process test element groups (TEGs) can be reduced, and TEGs can easily be prepared.

Another wiring structure has been proposed in which, in addition to a wiring grid having a first wiring and a second wiring respectively formed in X- and Y-directions as described above, third and fourth wirings are designed on an oblique wiring grid so as to form an angle of 45 degrees and another angle of 135 degrees from the X-direction. See, for example, Japanese Patent Laid-Open No. 2001-142931, Japanese Patent Laid-Open No. 2000-82743 and Japanese Patent-Laid-Open No. H9-148444.

In ordinary cases of forming the above-described wiring structures, holes are formed in an interlayer dielectric film and conductive members are embedded in the holes or a wiring material film is etched. A lithography technique is ordinarily used to form a resist mask which is used when the holes are formed or when the wiring material film is etched.

However, with the recent tendency to make wiring patterns finer, various problems have arisen in lithography techniques. In some cases, the method for wiring design on a square grid (also called "uniform grid") in particular cannot be used. As one reason for this, there is a resist receding (shrink) problem described below.

Generally speaking, if patterns become finer, the difference between a design size and the actual size of a resist pattern, called critical dimension shift (hereinafter referred to as "CD shift"), becomes larger.

FIG. 14 is a diagram showing a wiring width dependence of the CD shift in the lengthwise direction of a wiring. That is, FIG. 14 is a diagram showing the relationship between the width of a wiring (wiring width) and the CD shift in the lengthwise direction of the wiring. Here, the wiring is an isolated wiring.

As shown in FIG. 14, the CD shift tends to increase as the width of the isolated wiring is reduced. This is thought to be because the cut shape of the resist is degraded if the left opening area of the resist is reduced. For example, while the CD shift when the width of the isolated wiring is 0.4 µm is 0.02 µm, the CD shift when the width of the isolated wiring is 0.2 µm, is 0.06 µm. To reduce the influence of this CD shift on the transferred pattern configuration, a method (mask bias technique) for is known in which the amount of shrinking of the resist (CD shift) is estimated at the design stage, and the size of a mask (e.g., chromium mask) pattern is increased by an amount corresponding to the CD shift. For example, in a case where an isolated wiring having a width of 0.2 µm and a length of 700 µm is formed, a chromium mask having a length of 700.06 µm, which is the sum of 700 µm and the CD shift 0.06 µm shown in FIG. 14, is formed. Under exposure using this mask, the resist pattern after development is shrunk in the wiring lengthwise direction to have the same size (700 µm in length) as the design size. In FIG. 14, a region in which a design using a square grid is adaptable is hatched. If the mask bias technique is used by considering the CD shift in a case where the wiring width is smaller than 0.15 µm, wirings, which are placed with the minimum space set therebetween to avoid contact therebetween, contact each other. That is, a problem arises that a wiring design cannot be made on a square grid because the CD shift becomes larger than the wiring space margin.

Also, a method of adding a correction pattern to angular portions of a mask pattern in order to correct the CD shift due to a reduction of the angular portions of the resist pattern has been used.

As described above, it has been found that there is a problem with an application of the mask bias technique to wiring layout on a square grid when the width of isolated wirings is smaller than 0.15 µm. It is difficult to correct the CD shift with the mask bias technique or the method of adding a correction pattern when a finer pattern is used. That is, while the CD shift increases as the wiring width is reduced, the wiring space margin is reduced when a finer pattern having dense pattern lines is used, resulting in failure to form a CD-shift-corrected mask pattern. Consequently, it is difficult to make a correction by the mask bias technique.

With the multilayer wiring structure, there is also a problem that the process margin for vias becomes smaller relative to the process margin for wirings, and defects can occur easily in a via opening process. This is due to a low via data rate. FIG. 15 is a diagram showing a wiring length dependence of the data rate in a device region. The size of the device region is 17 µm×17 µm. A case in which wirings having a width of 0.1 µm and vias having a size of 0.1 µm×0.1 µm are placed with a minimum pitch of 200 nm in this device region will be described. When the wiring length of the first wirings or the second wirings is equal to a minimum length of 500 nm, the wiring data rate is about 27%. When the wiring length is equal to a device region limit of 17 μm, the wiring data rate is 50%. Thus, the wiring data rate is about 27 to 50%. On the other hand, as shown in FIG. 15 it is found that the via data rate is smaller by two orders of magnitude than the wiring data rate. Since the via data rate is low as described above, the light intensity in exposure at the time of via formation is weak and the optical contrast is reduced. If the diameter of the vias to be formed is small in such a state where the optical contrast is reduced, the depth of focus (DOF) is considerably reduced as shown in FIG. 16 and the via piercing characteristic degrades, resulting in a change in resist size. FIG. 16 is a diagram showing a via size dependence of the DOF. Also, if the etching process is designed by considering the density dependence of via etching, the isolated via piercing characteristic in particular degrades, resulting in a considerably large increase in the time required for etching including a loading effect. Thus, the amount of variation in the etching process with respect to variation in resist size is increased and it is not possible to form vias with high reproducibility.

SUMMARY OF THE INVENTION

The present invention has been conceived to solve the previously-mentioned problems and a general object of the present invention is to provide novel and useful semiconductor device and is to provide novel and useful method for manufacturing a semiconductor device.

A more specific object of the present invention is to provide a semiconductor device having an improved wiring structure capable of accurate pattern formation with a tolerance.

The above object of the present invention is attained by a following semiconductor device and a following method for manufacturing a semiconductor device.

According to first aspect of the present invention, the semiconductor device comprises: a first wiring layer including a plurality of first wirings formed above the substrate; a contact layer formed on the first wiring layer and including a plurality of contacts connected to the first wirings; and a second wiring layer formed on the contact layer and including a plurality of second wirings connected to the contacts. A contact pitch which is the sum of a length of the contacts in the diagonal direction and a space between adjacent contacts is larger than a first minimum wiring pitch which is the sum of the minimum of a space between adjacent first wirings and a width of the first wirings, or a second minimum wiring pitch which is the sum of the minimum of a space between adjacent second wirings and a width-of the second wirings.

According to second aspect of the present invention, the method for manufacturing a semiconductor device, comprises: forming a first interlayer dielectric film above a substrate; forming first trenches in the first interlayer dielectric film; forming first wirings by embedding a conductive films in the first trenches; forming a second interlayer dielectric film on the first interlayer dielectric film and the first wirings; forming via holes connected to the first wirings in the second interlayer dielectric film; forming via contacts by embedding a conductive film in the via holes; forming a third interlayer dielectric film on the second dielectric film and the via contacts; forming second trenches connected to the via contacts in the third interlayer dielectric film; and forming second wirings by embedding a conductive film in the second trenches. The via contacts are formed with a contact pitch larger than a minimum wiring pitch of the first wirings, or a minimum wiring pitch of the second wirings.

According to third aspect of the present invention, the method for manufacturing a semiconductor device, comprises: forming a first interlayer dielectric film above a substrate; forming first trenches in the first interlayer dielectric film; forming first wirings by embedding a conductive films in the first trenches; forming a second interlayer dielectric film on the first interlayer dielectric film and the first wirings; forming second trenches in the second interlayer dielectric film; forming, via holes connected to the first wirings in the second interlayer dielectric film located under the second trenches; and forming via contacts and second wirings by embedding a conductive film in the via holes and the second trenches. The via contacts are formed with a contact pitch larger than a minimum wiring pitch of the first wirings, or a minimum wiring pitch of the second wirings.

Other objects and further features of the present invention will be apparent from the following detailed description when read in conjunction with the accompanying drawings.

DETAILED DESCRIPTION OF THE PREFERRED EMBODIMENTS

Figure 1:
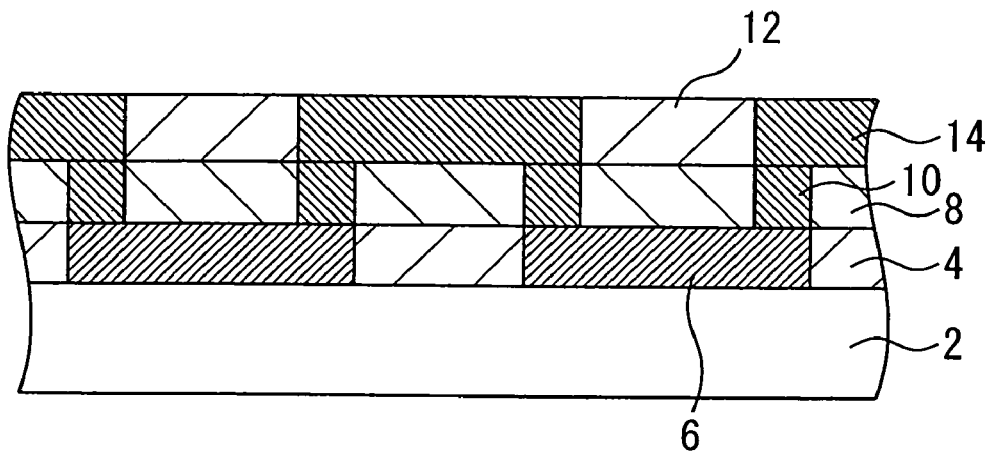
FIG. 1 is a schematic cross-sectional view of a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

Figure 2:
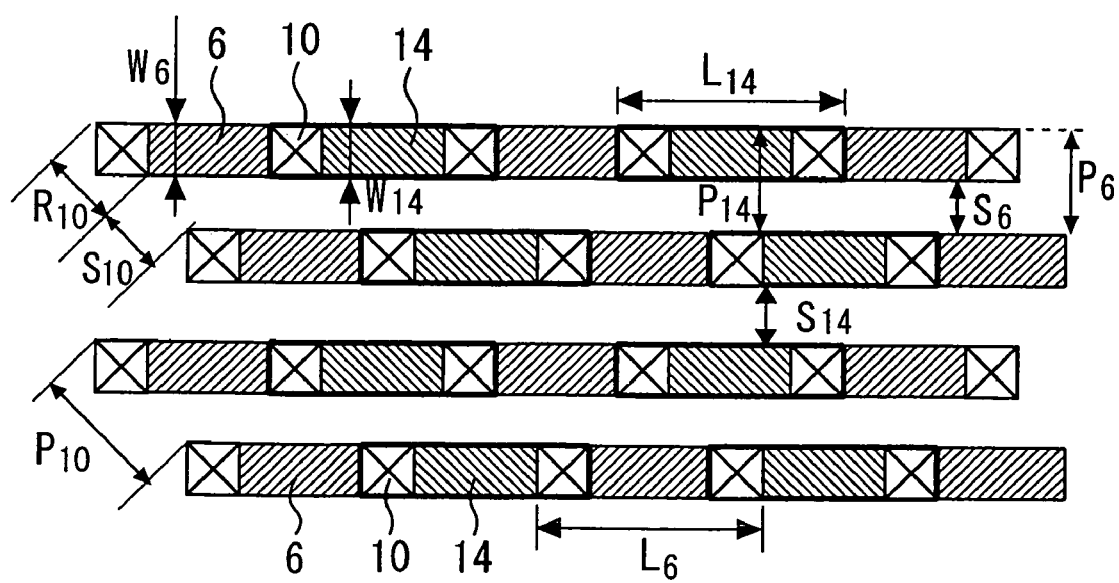
FIG. 2 is a schematic top view of the wiring structure of the semiconductor device in the first embodiment of the present invention.

FIG. 1 is a schematic cross-sectional view of a semiconductor device according to a first embodiment of the present invention, and FIG. 2 is a schematic top view of the wiring structure of the semiconductor device in the first embodiment of the present invention.

As shown in FIGS. 1 and 2, transistors, wiring layers, etc., (not shown) are formed as required on a substrate 2 of the semiconductor device in the first embodiment. A first interlayer dielectric film 4 constituting a first wiring layer is also formed on the substrate 2. First wirings 6 are formed in the first interlayer dielectric film 4. The thickness of the first interlayer dielectric film 4 and the first wirings 6 is about 200 nm. A second interlayer dielectric film 8 constituting a via layer is formed on the first interlayer dielectric film 4 and the first wirings 6. Vias 10 are formed in the second interlayer dielectric film 8 so as to be connected to the first wirings 6 through the second interlayer dielectric film 8. The thickness of the second interlayer dielectric film 8 and the via 10 layer is about 200 nm. A third interlayer dielectric film 12 constituting a second wiring layer is formed on the second interlayer dielectric film 8 and the vias 10. Second wirings 14 are formed in the third interlayer dielectric film 12. The thickness of the third interlayer dielectric film 12 and the second wiring 14 is about 200 nm. The second wirings 14 are connected to the vias 10 as required. That is, the first wirings 6 and the second wirings 14 are electrically connected at necessary positions by the vias 10.

FIG. 2 shows only the wirings 6 and 14 and the vias 10 by omitting the first and second interlayer dielectric films 4, 8, and 12 in the wiring layers. In FIG. 2, a hatched area having lines descending to the left indicates the first wirings 6, while a hatched area having lines descending to the right indicates the second wirings 14. Square symbols containing × therein indicate the vias 10. At the vias 10, overlapping portions of the second wiring 14 and the first wiring 6 are superposed on each other as viewed in the vertical direction. These portions of the first and second wirings 6 and 14 are connected to each other by the vias 10. In the portion shown in FIG. 2, the first wirings 6 and the second wirings 14 are placed in parallel with each other.

For ease of description in this specification, the measurements in the horizontal and vertical directions of FIG. 2 will be referred to as "length" and "width", respectively, unless otherwise specified.

The wiring structure of the semiconductor device in the first embodiment will be described with reference to FIG. 2.

For example, the first wirings 6 and the second wirings 14 have wiring length $L_6$ and $L_{14}$ of 500 nm and wiring widths $W_6$ and $W_{14}$ of 100 nm. The space $S_6$ between each adjacent first wirings 6 is 100 nm, and the space $S_{14}$ between each adjacent second wirings 14 is 100 nm. A wiring pitch $P_6$ which is the distance between each adjacent first wiring 6, i.e., the sum of the wiring widths $W_6$ of the first wirings 6 and the space $S_6$ between the first wirings 6, is 200 nm. Also, a wiring pitch $P_{14}$ which is the distance between each adjacent second wirings 14, i.e., the sum of the wiring widths $W_{14}$ and the space $S_{14}$, is 200 nm.

In the via layer, one of the vias 10 adjacent to another of the vias 10 is placed in a direction corresponding to a diagonal line of this via 10, that is, placed in a slanted direction at an angle of about 45 degrees from the lengthwise directions of the first and second wirings 6 and 14. The vias 10 have a width $W_{10}$ of 100 nm and a length $L_{10}$ of 100 nm equal to the wiring widths $W_6$ and $W_{14}$. The length of the vias 10 in the diagonal direction, i.e., the diameter $R_{10}$, is $\sqrt{2}$ times the wiring widths $W_6$ and $W_{14}$, 140 nm. The space $S_{10}$ between each adjacent vias 10 in a direction corresponding to the diagonal direction of the vias 10 is $\sqrt{2}$ times the wiring widths $W_6$ and $W_{14}$, that is, 140 nm. Accordingly, a pitch $P_{10}$ which is the interval between each adjacent vias 10 in a direction corresponding to the diagonal direction of the vias 10 is 280 nm. In a case where the wirings and the vias are placed on a square grid, the packing density of the vias 10 is maximized if the vias 10 are placed so that the via pitch $P_{10}$ is $\sqrt{2}$ times the wiring pitch as described above. In the structure shown in FIG. 2, the vias 10 can be uniformly placed with the pitch $P_{10}$ equal to $\sqrt{2}$ times the wiring pitch (280 nm) on a square grid to improve the process margin for the vias 10 and to reduce them is alignment between the wirings and the vias.

Next, a method for manufacturing the above-described semiconductor device, specifically, a method for forming the multilayer wiring structure will be described.

Figure 3A:
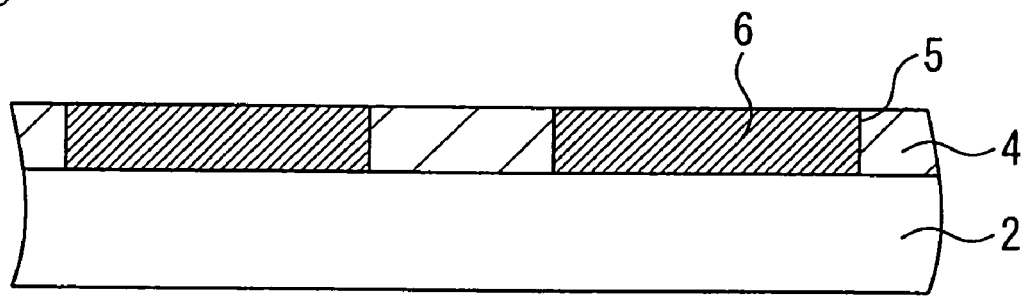
FIGS. 3A to 3C are process sectional views for illustrating a method for manufacturing the semiconductor device according to the first embodiment of the present invention.
Figure 3B:
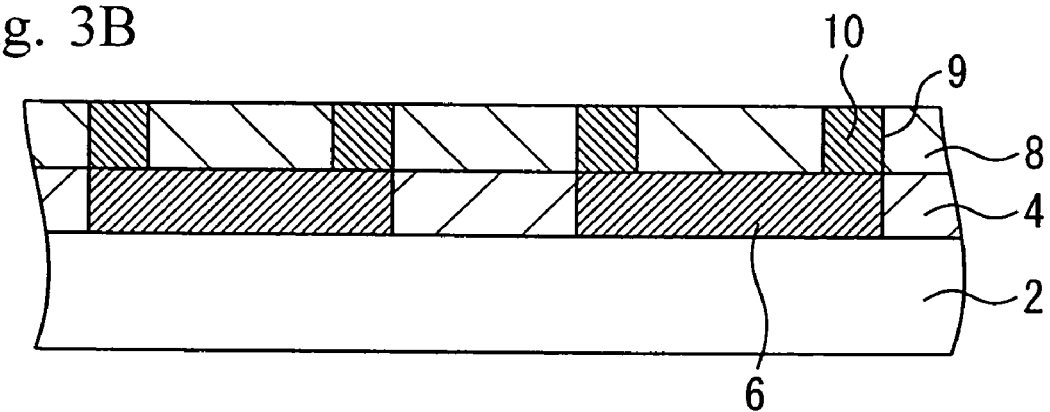
Figure 3C:
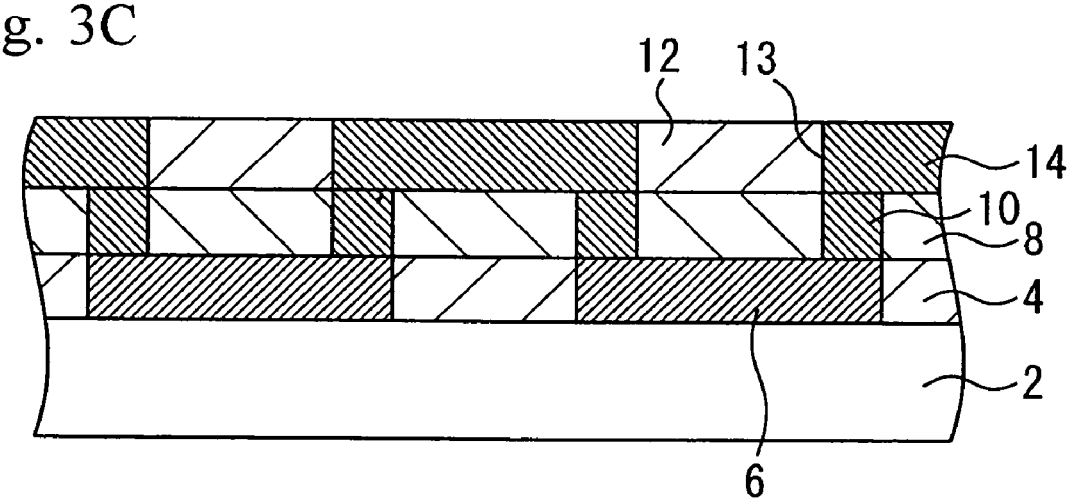

FIGS. 3A to 3C are process sectional views for illustrating a method for manufacturing the semiconductor device according to the first embodiment. Specifically, FIGS. 3A to 3C are process sectional views for illustrating a method for forming a wiring structure by a single damascene method.

First, semiconductor elements (for example, transistors) are formed on substrate 2. Next, as FIG. 3A shows, a first interlayer dielectric film 4 is formed with a thickness of 200 nm above the substrate 2. Trenches 5 for first wirings are formed in the first interlayer dielectric film 4 using lithography technique and dry etching technique. A conductive film such as Cu film is deposited in the trenches 5 and on the first interlayer dielectric film 4. Then, unnecessary conductive film is removed by CMP using the first interlayer dielectric film 4 as a stopper film. Thus, the conductive film is embedded in the trenches 5 to form first wirings 6.

Next, as FIG. 3B shows, a second interlayer dielectric film 8 is formed with a thickness of 200 nm on the first interlayer dielectric film 4 and the first wirings 6. Via holes 9 connected to the first wirings 6 are formed in the second interlayer dielectric film 8 using lithography technique and dry etching technique. Vias 10 are formed by embedding a conductive film in the via holes 9 in the same manner as the first wirings 6. Here, vias 10 are formed with a contact pitch larger than the minimum wiring pitch of the first wirings 6 or second wirings (described later).

Next, as FIG. 3C shows, a third interlayer dielectric film 12 is formed with a thickness of 200 nm on the second interlayer dielectric film 8 and the vias 10. Trenches 13 for the second wirings and connected to the vias 10 are formed in the third interlayer dielectric film 12 using lithography technique and dry etching technique. The second wirings 14 are formed by embedding a conductive film in the trenches 13 in the same manner as the first wirings 6.

The semiconductor device shown in FIGS. 1 and 2 is formed through the above-described steps.

Figure 4:
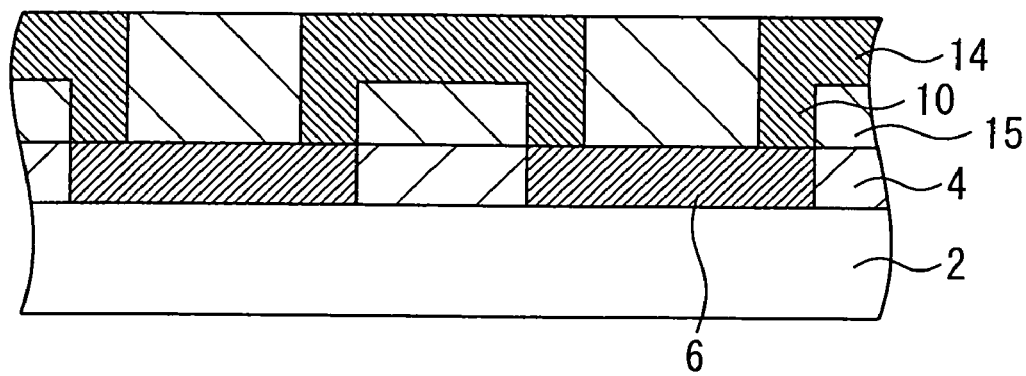
FIG. 4 is a schematic cross-sectional view of a multilayer wiring structure formed by a dual damascene method in the first embodiment.
Figure 5A:
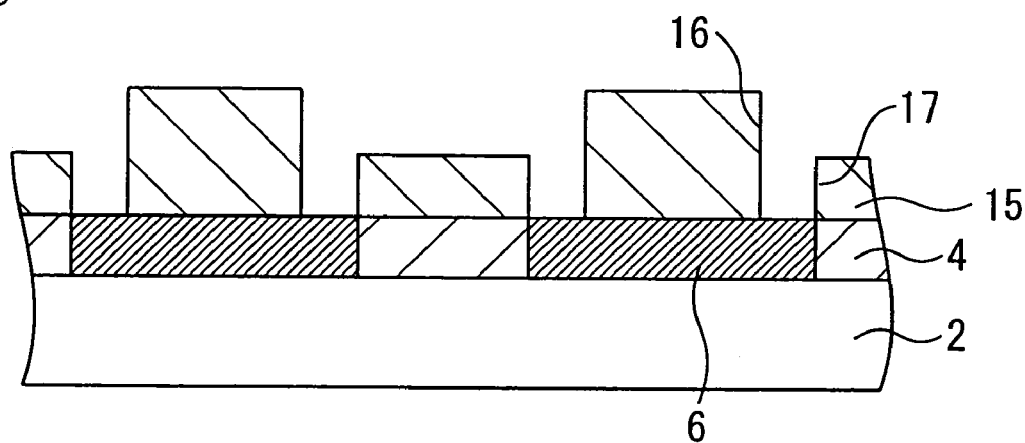
FIGS. 5A and 5B are process sectional views for illustrating a method for manufacturing the semiconductor device shown in FIG. 4.
Figure 5B:
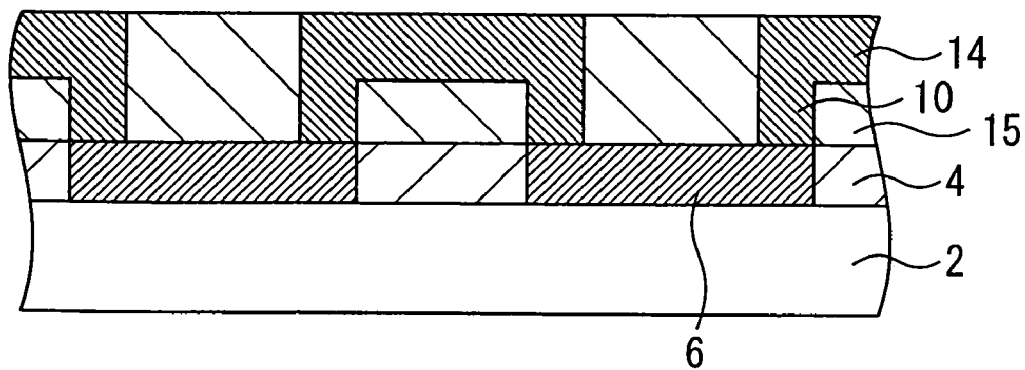

While a multilayer wiring structure formed by a single damascene method is shown in FIG. 1, a multilayer wiring structure may be formed by a dual damascene method, as shown in FIGS. 4 and 5. FIG. 4 is a schematic cross-sectional view of a multilayer wiring structure formed by a dual damascene method in the first embodiment. FIGS. 5A and 5B are process sectional views for illustrating a method for manufacturing the semiconductor device shown in FIG. 4.

As shown in FIG. 4, a second interlayer dielectric film 15 is formed on the first interlayer dielectric film 4 and the first wirings 6. In the second interlayer dielectric film 15, vias 10 connected to the first wirings 6 and second wirings 14 connected to vias 10 are formed. The thickness of the second interlayer dielectric film 15 is, for example, about 400 nm.

Next, a method for manufacturing the semiconductor device shown in FIG. 4 will be described.

First, the first wirings 4 are formed in the first interlayer dielectric film 4 on the substrate 2 in the same manner as in FIG. 3A.

Next, as FIG. 5A shows, a second interlayer dielectric film 15 is formed with a thickness of 400 nm on the first interlayer dielectric film 4 and the first wirings 6. Trenches 16 for second wirings are formed in the second interlayer dielectric film 15 using lithography technique and dry etching technique. Further, via holes 17 are formed in the second interlayer dielectric film 15 positioned under the trenches 16 using lithography technique and dry etching technique.

Next, as FIG. 5B shows, a conductive film such as Cu film is deposited in the via holes 17 and the trenches 16 and on the second interlayer dielectric film 15. Then, unnecessary conductive film is removed by CMP using the second interlayer dielectric film 15 as a stopper film. Thus, the conductive film is embedded in the via holes 17 and the trenches 16 to form vias 10 and second wirings 14.

Figure 6:
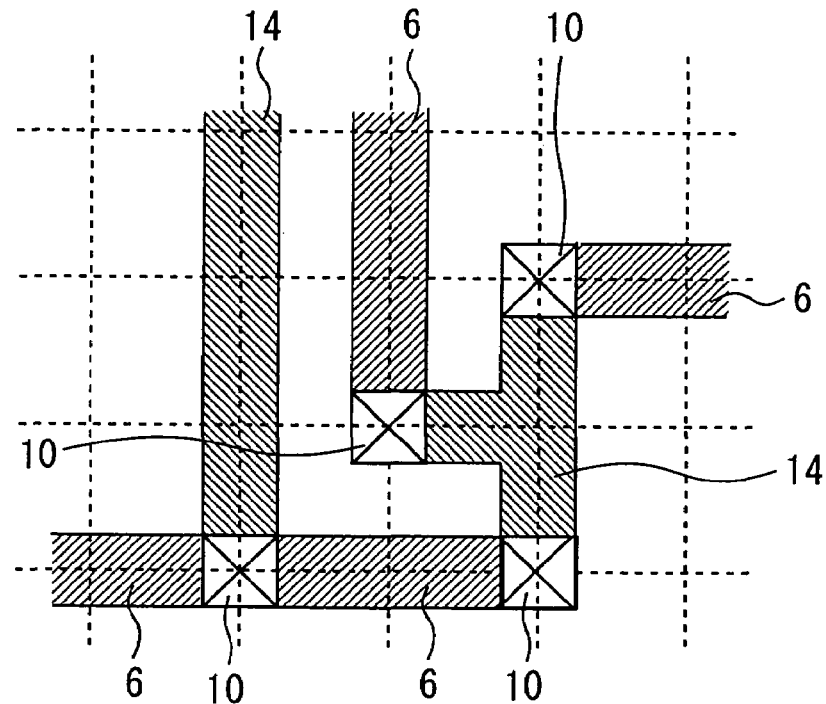
FIG. 6 is a plan view showing an example of placement of wirings and vias on a square grid in the first embodiment.

FIG. 6 is a plan view showing an example of placement of wirings and vias on a square grid in the first embodiment. Wirings 6 and wirings 14 are, unlike those shown in FIG. 2, not placed in parallel with each other. As shown in FIG. 6, the first wirings 6 and the second wirings 14 are placed with a minimum pitch of 200 nm on a square grid having a pitch of 200 nm (indicated by dotted lines in the figure). The first wirings 6 and the second wirings 14 are connected to vias 10 at predetermined positions. The vias 10 are placed with a pitch equal to or larger than $\sqrt{2}$ times the minimum wiring pitch 200 nm (i.e., 280 nm). Also in the structure shown in FIG. 6, the vias 10 can be placed on the square grid with a pitch equal to or larger than $\sqrt{2}$ times the wiring pitch to improve the process margin for the vias 10 and to reduce the misalignment between the wirings and the vias.

In the first embodiment of the present invention, as described above, the vias 10 are placed so that the via pitch is larger than the minimum wiring pitch, thereby maintaining a sufficient space between the vias 10. Therefore, it is possible to add a correction pattern to via portions and to make a correction by the mask bias technique. Consequently, wiring can be formed by securing a via process margin even in a finer wiring structure.

Figure 7:
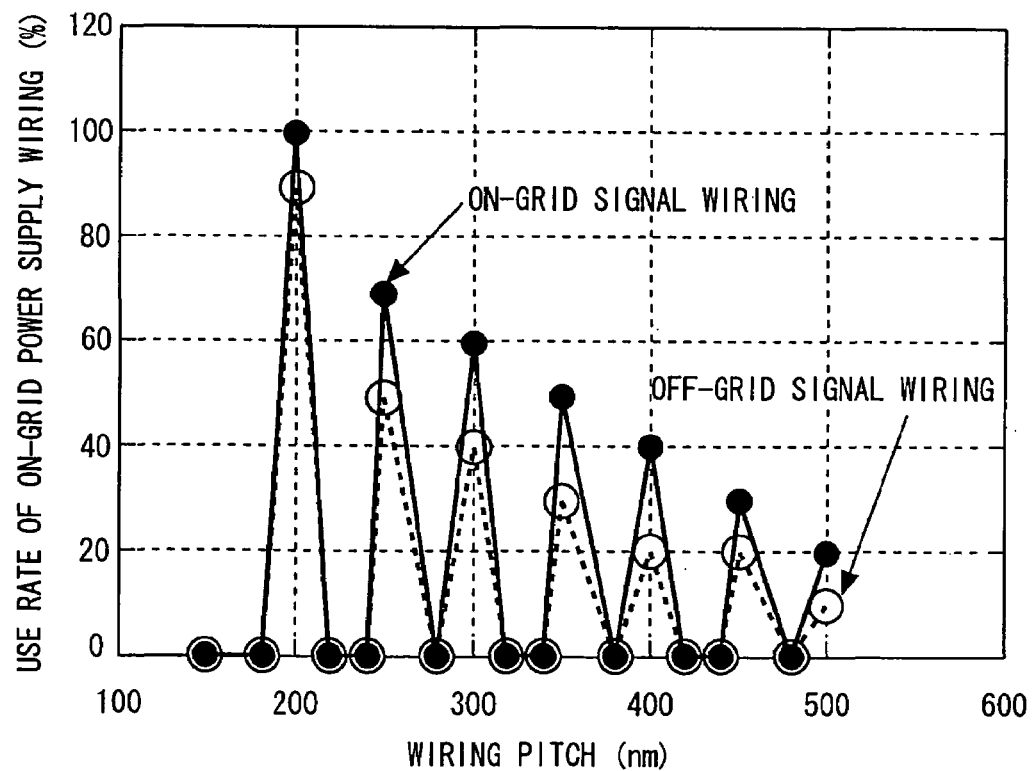
FIG. 7 is a diagram showing a wiring pitch dependence of the rate of use of power wiring placed on a square grid in the first embodiment of the present invention.
Figure 8:
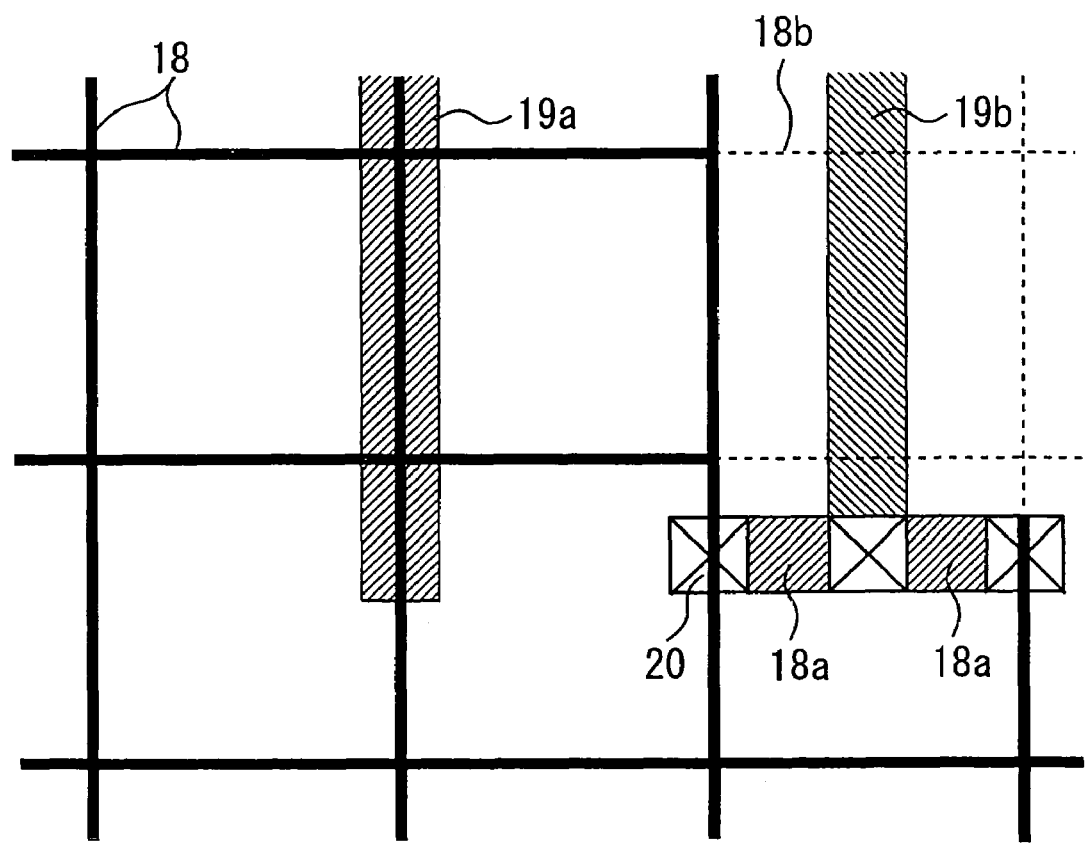
FIG. 8 is a plan view of signal wirings placed on the grid and signal wirings placed off the grid.

FIG. 7 is a diagram showing a wiring pitch dependence of the rate of use of power wirings placed on a square grid in the first embodiment of the present invention. FIG. 8 is a plan view of signal wirings placed on the grid and signal wirings placed off the grid. FIG. 7 shows comparison between the use rate of power wirings in the case of on-grid placement of the signal wiring and the use rate of power wirings in the case of off-grid placement of the signal wiring.

In a semiconductor device, power wirings are placed with different wiring pitches. It is assumed here that the use rate of power wirings placed with a pitch of 200 nm is 100%. The use rate of wiring is reduced if the wiring pitch of the power wiring is increased.

A case where signal wirings are placed with priority over power wirings will be described. If signal wiring 19a is placed in an on-grid manner, that is, placed on a power supply mesh, there is no need to change the layout of power wiring 18 with respect to the signal wiring 19a. On the other hand, if the signal wiring 19b is placed in an off-grid manner, there is a need to change the layout of the power wiring 18 with respect to the signal wiring 19b. That is, it is necessary to place off-grid power wiring 18a in place of on-grid power wiring 18b. If off-grid power wiring 18a is formed in this manner, the power supply mesh is virtually collapsed.

With the recent increasing higher integration of transistors, there has been a need to control the off current with accuracy and reduce the power supply voltage. In the generation after the 130 nm node, the power supply voltage is 1.5 V or less and a voltage drop may occur easily. There is a demand for uniformly supplying the power supply voltage in order to prevent this voltage drop.

If the present invention is applied to signal wiring, the signal wirings can be placed in an on-grid manner to improve the use rate of power wiring placed in an oh-grid manner and to thereby prevent collapse of the power supply mesh. Thus, a power supply structure capable of uniformly supplying a power supply voltage can be realized.

In the present invention, the wiring width, length and pitch of the first and second wirings are not limited to those mentioned in the description of the first embodiment. Also, the widths, diameter and pitch of the contacts (vias 10 in the first embodiment) are not limited to those mentioned in the description of the first embodiment. However, it is necessary that the contact pitch is larger than the wiring pitch.

While description has been made of a case where each adjacent vias are placed in a direction corresponding to the diagonal direction of the vias, the direction in which the vias are placed is not limited to that corresponding to the diagonal direction. Vias may be placed in such a manner that one via is placed in an oblique direction from another via closest to the one via so that the distance therebetween is larger than the wiring pitch.

Figure 14:
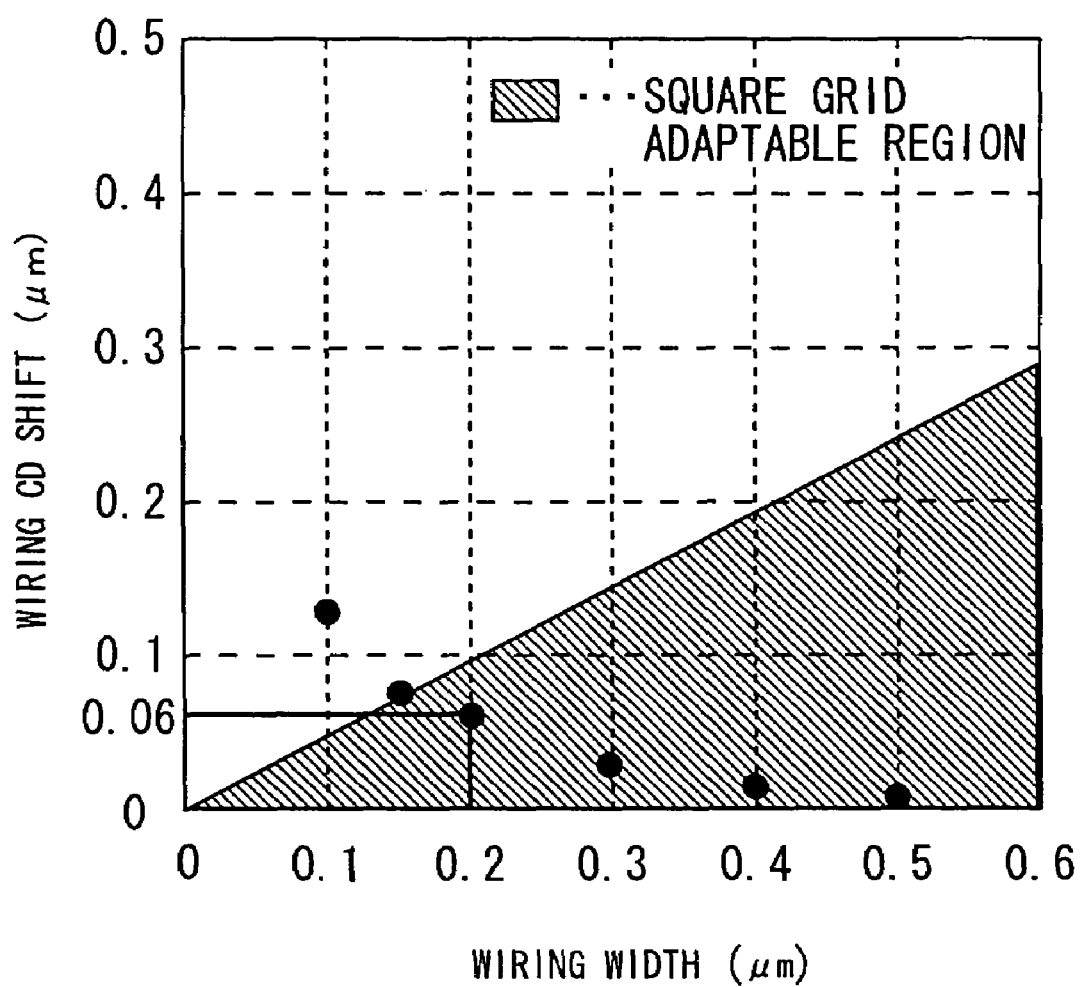
FIG. 14 is a diagram showing the relationship between the width of a wiring (wiring width) and the CD shift in the lengthwise direction of the wiring.
Figure 15:
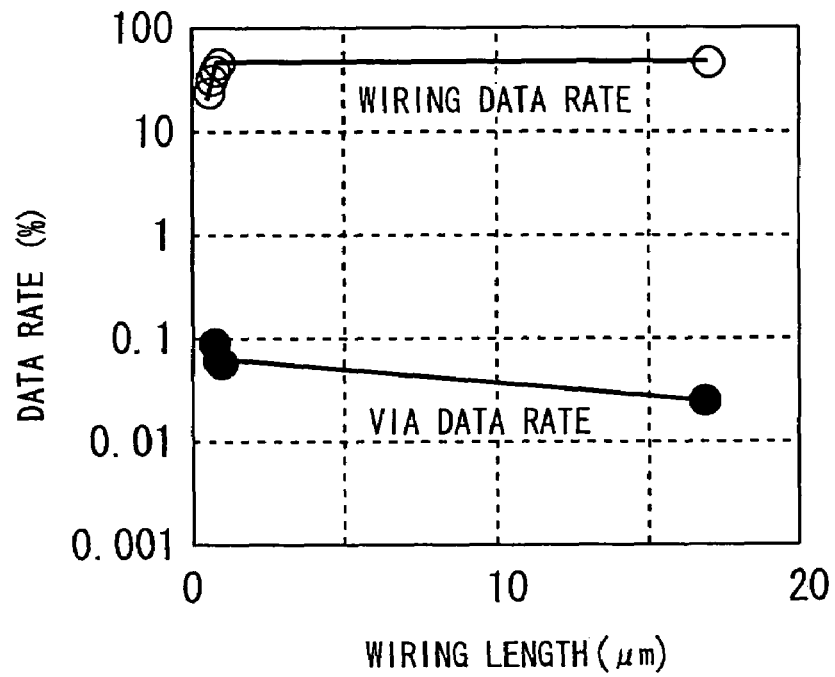
FIG. 15 is a diagram showing a wiring length dependence of the data rate in a device region.
Figure 16:
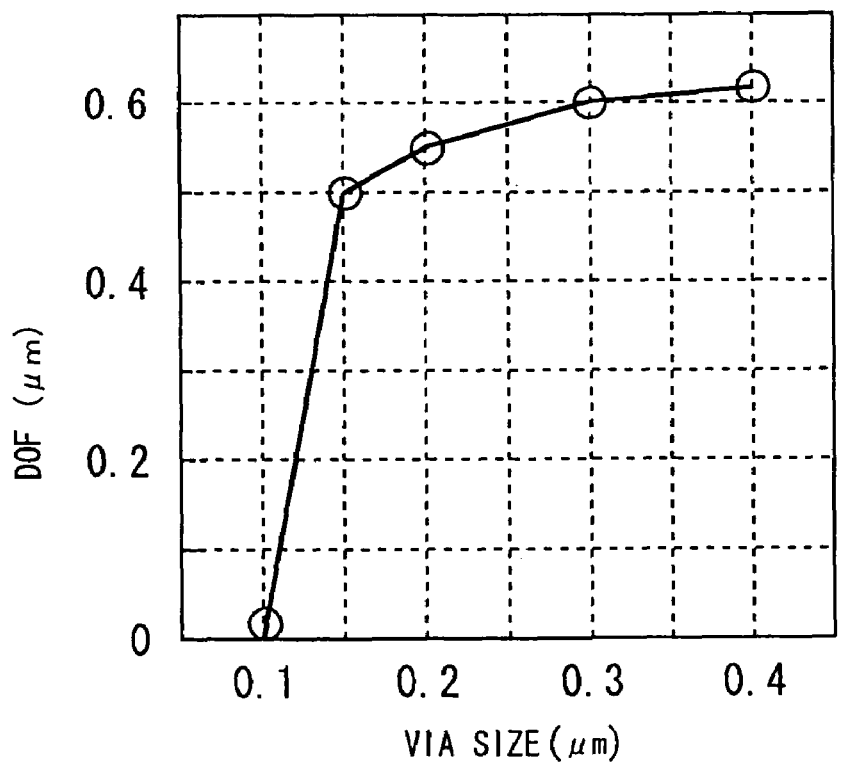
FIG. 16 is a diagram showing the relationship between a via size and a DOF.

That is, wiring and vias can be placed on an irregular grid not uniform in X- and Y-directions. In such a case, the vias connecting the wiring are placed with a pitch larger than the minimum pitch of the wiring. If the pitch of the vias is larger than the minimum pitch of the wiring, the wiring and the vias may be placed at positions not corresponding to a grid. That is, the wiring and the vias may be placed in an off-grid manner. If the wiring width of isolated wirings is smaller than 0.15, no layout can be adapted to a square grid, as shown in FIG. 14. In such a case, an off-grid layout may be designed. (The same can also be the with respect to the second embodiment of the present invention described below).

Second Embodiment

Figure 9:
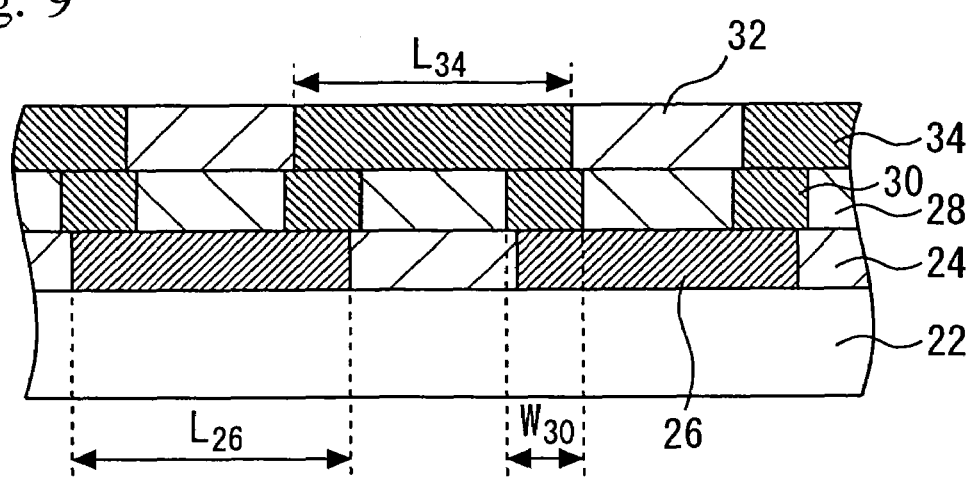
FIG. 9 is a schematic cross-sectional view of a semiconductor device according to a second embodiment of the present invention.
Figure 10:
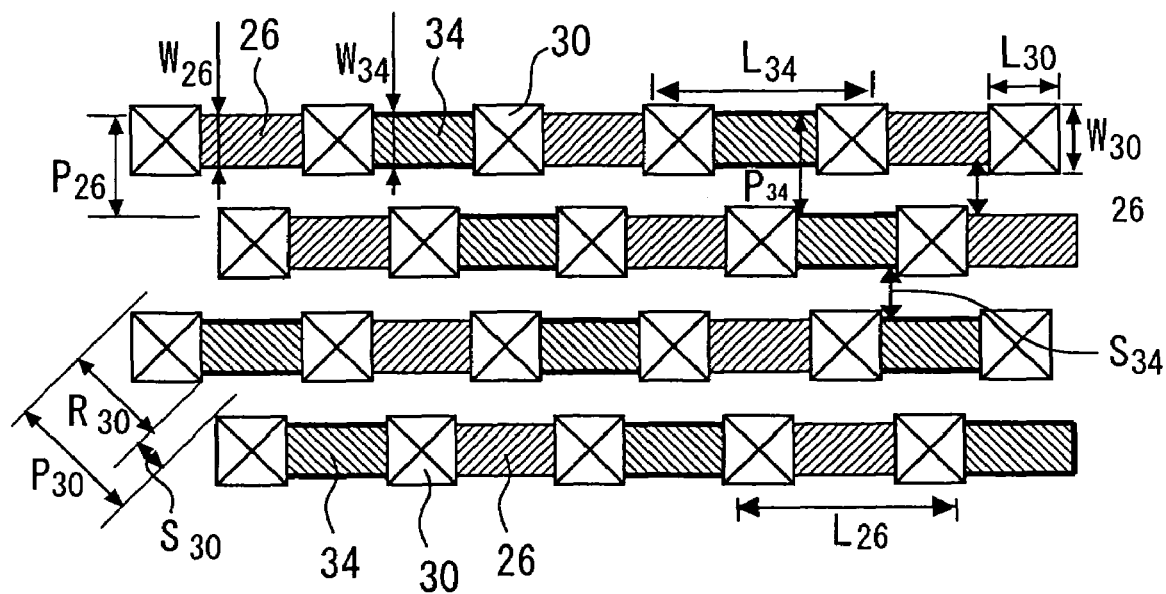
FIG. 10 is a schematic top view of the wiring structure of the semiconductor device in the second embodiment.

FIG. 9 is a schematic cross-sectional view of a semiconductor device according to a second embodiment of the present invention. FIG. 10 is a schematic top view of the wiring structure of the semiconductor device in the second embodiment.

As shown in FIGS. 9 and 10, the semiconductor device in the second embodiment is similar to the semiconductor device in the first embodiment described above. However, vias of the semiconductor device in the second embodiment are formed so as to be larger than the wiring width. Concrete description of this will be made below.

In the semiconductor device in the second embodiment, a first interlayer dielectric film 24 constituting a first wiring layer is formed on the substrate 22, as is that of the semiconductor device in the first embodiment. First wirings 26 are formed in the first interlayer dielectric film 24. The thickness of the first interlayer dielectric film 24 and the first wirings 26 is about 200 nm. A second interlayer dielectric film 28 constituting a via layer is formed on the first interlayer dielectric film 24. Vias 30 are formed in the second interlayer dielectric film 28. The vias 30 are connected to predetermined portions of the first wirings 26. The thickness of the second interlayer dielectric film 28 and the vias 30 is about 200 nm. A third interlayer dielectric film 32 constituting a second wiring layer is formed on the second interlayer dielectric film 28. Second wirings 34 are formed in the third interlayer dielectric film 32. The thickness of the third interlayer dielectric film 32 and the second wirings 34 is about 200 nm. The second wirings 34 are connected to the vias 30 at predetermined positions. The first wirings 26 and the second wirings 24 are thereby connected electrically to each other.

FIG. 10 shows only the wirings 26 and 34 and the vias 30 by omitting the interlayer dielectric films 24, 28, and 32 in the wiring layers. In FIG. 10, a hatched area having lines descending to the left indicates the first wirings 26, while a hatched area having lines descending to the right indicates the second wirings 34. Square symbols containing × therein indicate the vias 30. At the vias 30, overlapping portions of the second wiring 34 and the first wiring 26 are superposed on each other as viewed in the vertical direction. These portions of the first and second wirings 26 and 34 are connected to each other by the vias 30. In the portion shown in FIG. 10, the first wirings 26 and the second wirings 34 are placed in parallel with each other.

For ease of description in this specification, the measurements in the horizontal and vertical directions of FIG. 10 will be referred to as "length" and "width", respectively, unless otherwise specified.

Referring to FIG. 10, the first wirings 26 and the second wirings 34 have the same wiring length, width, space and pitch as those of the first wiring 6 and the second wiring 14 in the first embodiment. More specifically, the first wirings 26 and the second wirings 34 have wiring length $L_{26}$ and $L_{34}$ of 500 nm, wiring widths $W_{26}$ and $W_{34}$ of 100 nm, wiring space $S_{26}$ and $S_{34}$ of 100 nm, and wiring pitches $P_{26}$ and $P_{34}$ of 200 nm.

The vias 30 have a width $W_{30}$ of 127 nm and a length $L_{30}$ of 127 nm, which are larger by 27 nm than the wiring widths $W_{26}$ and $W_{34}$. The length of the vias 30 in the diagonal direction, i.e., the diameter $R_{30}$, is 180 nm, slightly larger than $\sqrt{2}$ times the wiring widths $W_{26}$ and $W_{34}$. The space $S_{30}$ between each adjacent vias 30 in a direction corresponding to the diagonal direction of the vias 30 is 100 nm. Accordingly, a pitch $P_{30}$ which is the interval between each adjacent vias 30 in a direction corresponding to the diagonal direction of the vias 30 is 280 nm, i.e., $\sqrt{2}$ times the minimum wiring pitches $P_{26}$ and $P_{34}$. In a case where the wirings and the vias are placed on a square grid, the packing density of the vias 30 is maximized if the vias 30 are placed so that the via pitch $P_{30}$ is $\sqrt{2}$ times the wiring pitch as described above. In the structure shown in FIG. 10, the vias 30 can be uniformly placed with the pitch $P_{30}$ equal to $\sqrt{2}$ times the wiring pitch (about 280 nm) on a square grid to improve the process margin for the vias 30 and to reduce the misalignment between the wirings and the vias.

Figure 11:
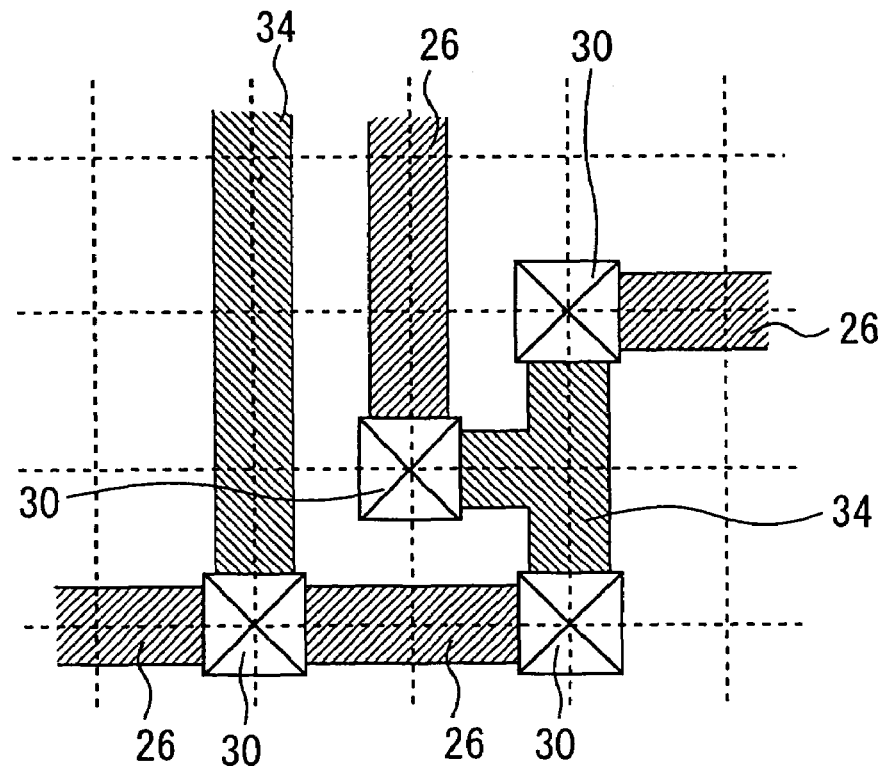
FIG. 11 is a plan view showing an example of placement of the wirings and vias on a square grid in the second embodiment.

FIG. 11 is a plan view showing an example of placement of the wirings and vias on a square grid in the second embodiment. Wirings 26 and wirings 34 are, unlike those shown in FIG. 10, not placed in parallel with each other. As shown in FIG. 11, the first wirings 26 and the second wirings 34 are placed with a minimum pitch of 200 nm on a square grid having a pitch of 200 nm (indicated by dotted lines in the figure). The first wirings 26 and the second wirings 34 are connected through vias 30 at predetermined positions. The vias 30 are placed with a pitch equal to or larger than $\sqrt{2}$ times the minimum wiring pitch 200 nm (i.e., 280 nm). Also in the structure shown in FIG. 9, the vias 30 can be placed on the square grid with a pitch equal to or larger than $\sqrt{2}$ times the wiring pitch to improve the process margin for the vias 30 and to reduce the misalignment between the wirings and the vias.

Figure 12:
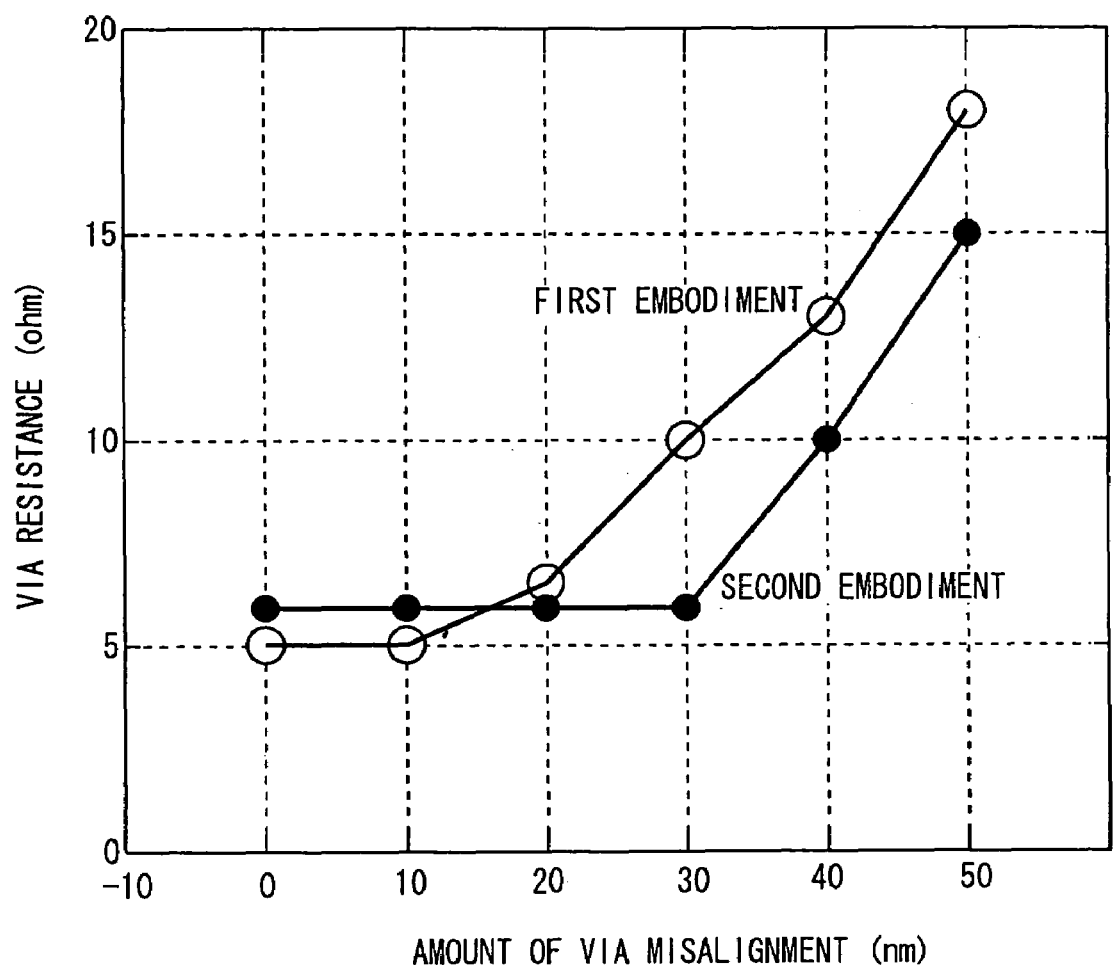
FIG. 12 is a diagram showing the relationship between the amount of via misalignment and the via resistance in the second embodiment.
Figure 13:
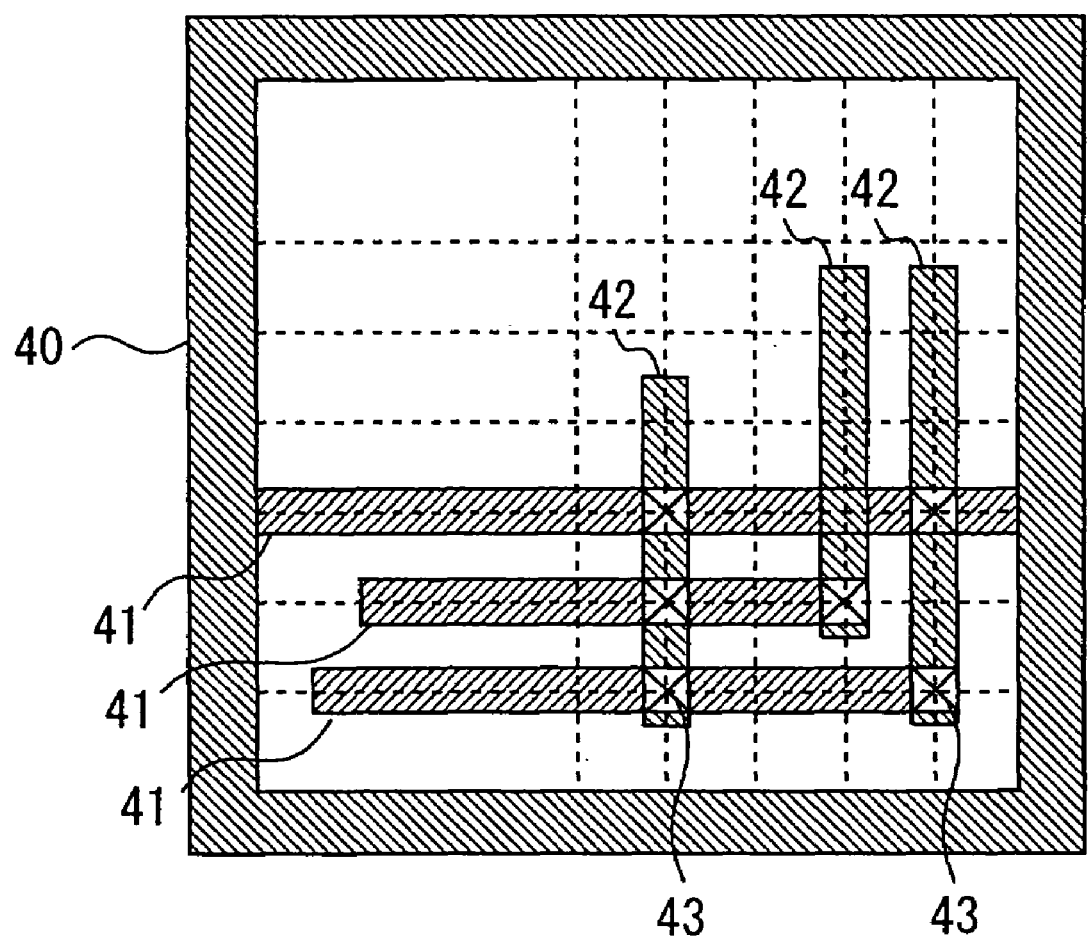
FIG. 13 is a plan view showing a semiconductor device having a power supply ring.

FIG. 12 is a diagram showing the relationship between the amount of via misalignment and the via resistance in the second embodiment. For comparison, data on the arrangement having the same via size and wiring width in the first embodiment is shown.

As shown in FIG. 12, in a case where a misalignment of, for example, about 30 nm occurs in the semiconductor device of the first embodiment having the same via width and wiring width, the via resistance increases abruptly by about 5 Ω (ohm) from the value when the misalignment is 0 (zero). On the other hand, even if a misalignment of, for example, about 30 nm occurs in the semiconductor device of the second embodiment, the change in via resistance is small and the increase in via resistance due to the misalignment is limited to a small value. That is, since the size of the vias 30 in the semiconductor device of the second embodiment is increased relative to the first and second wiring widths $W_{26}$ and $W_{34}$ in contrast with the semiconductor device of the first embodiment, a larger tolerance can be provided with respect to a misalignment between the vias 30 and the first and second wirings 26 and 34. Therefore, a further increased tolerance can be obtained in comparison with the first embodiment with respect to lithography alignment accuracy. Such a tolerance ensures that the dielectric film withstanding characteristic at the via opening can be set to a low level, thus making it possible to provide a large process margin for a semiconductor device.

Also in the second embodiment, as described above, vias are placed so that the via pitch is larger then the minimum wiring pitch. In this way, a sufficient space can be provided between the vias 10. Therefore, it is possible to form patterns by adding a correction pattern to via portions or by making a correction by the mask bias technique. Consequently, a pattern can be formed with accuracy by setting a large process margin.

Further, in the second embodiment, the tolerance for alignment between the wiring and vias can be increased relative to that in the first embodiment by increasing the via size relative to the wiring width.

While the second embodiment has been described with respect to a case where the finished size $W_{30}$ of vias 30 is larger than the finished size $W_{26}$ and $W_{34}$ of wirings 26 and 34, failure to form fine vias according to a design may result in some cases due to a reduction in optical contrast or the like. According to the second embodiment, however, the width $W_{30}$ of vias 30 is set larger than the widths $W_{26}$ and $W_{34}$ of the conductors of wirings 26 and 34 at least in the design size. Therefore, the increase in via resistance can be limited even in a case where the size of vias 30 actually formed is smaller by a certain amount than the design size.

While the second embodiment has been described with respect to a case where the finished size $W_{30}$ of vias 30 is larger by about 27 nm than the finished size $W_{26}$ and $W_{34}$ of wirings 26 and 34, the difference between the widths of vias 30 and wirings 26 and 34 is not limited to this value. However, it is preferable to limit this width difference to about 20 to 40% of the wiring width.

In other respects, the second embodiment is the same as the first embodiment, and therefore the description will be omitted.

For example, the first wirings 6 and 26 in the first and second embodiments correspond to "first wirings" of the present invention, and the first wiring 6, the first interlayer dielectric film 4, the first wiring 26 and the first interlayer dielectric film 24 correspond to "first wiring layer" of the present invention. Also, for example, the second wirings 14 and 34 in the first and second embodiments correspond to "second wirings" of the present invention, and the second wiring 14, the third interlayer dielectric film 12, the second wiring 34 and the third interlayer dielectric film 32 correspond to "second wiring layer" of the present invention. Also, for example, the vias 10 and 30 in the first and second embodiment correspond to "contacts" of the present invention, and the vias 10, the second interlayer dielectric film 4, the vias 30 and the via layer second interlayer dielectric film 28 correspond to "contact layer" of the present invention.

Also, for example, the diameter $R_{30}$ of the vias 10 and 30 in the first and second embodiment correspond to "length of the contacts in the diagonal direction", the via space $S_{10}$ and $S_{30}$ correspond to "space between the adjacent contacts", and the via pitches $P_{10}$ and $P_{30}$ correspond to "contact pitch". Also, the widths $W_6$ and $W_{26}$ of the first wirings 6 and 26 correspond to "width of the first wirings" of the present invention, the space $S_6$ and $S_{26}$ between the first wirings 6 and 26 correspond to "space between adjacent first wirings", and the pitches $P_6$ and $P_{26}$ of the first wirings 6 and 26 correspond to "first minimum wiring pitch". Also, the widths $W_{14}$ and $W_{34}$ of the second wirings 14 and 34 correspond to "width of the second wiring" of the present invention, the space $S_{14}$ and $S_{34}$ between the second wirings 14 and 34 correspond to "space between adjacent second wirings", and the pitches $P_{14}$ and $P_{34}$ of the second wirings 14 and 34 correspond to "second minimum wiring pitch".

This invention, when practiced illustratively in the manner described above, provides the following major effects:

According to the present invention, the minimum wiring pitch of the first and second wirings of the semiconductor device is smaller than the minimum pitch of the contacts. Therefore, the contacts can be formed with a pitch larger than that in the layout of the first and second wirings, and a substantially large process margin in forming the contacts can be maintained. Consequently, the pattern can be formed with accuracy.

Further, the present invention is not limited to these embodiments, but variations and modifications may be made without departing from the scope of the present invention.

The entire disclosure of Japanese Patent Applications No. 2004-40830 filed on Feb. 18, 2004 and No. 2004-310773 filed on Oct. 26, 2004 containing specification, claims, drawings and summary are incorporated herein by reference in its entirety.

What is claimed is:

1. A semiconductor device comprising:
   a substrate;
   a first wiring layer including a plurality of first wirings on the substrate;
   a contact layer on the first wiring layer and including a plurality of contacts connected to the respective first wirings; and
   a second wiring layer on the contact layer and including a plurality of second wirings connected to respective contacts, wherein, in a view of the contacts substantially perpendicular to the substrate, minimum separation between centers of two closest contacts is at least $\sqrt{2}$ times minimum separation between centers of two adjacent first wirings.

2. The semiconductor device according to claim 1, including isolated wirings of the first and second wirings having a wiring width smaller than 150 nm, wherein the first and second wirings and the contacts are located in an off-grid layout.

3. The semiconductor device according to claim 1, wherein minimum design size of the width of at least one of the first wirings and the second wirings is smaller than a minimum design size of the contacts.

4. The semiconductor device according to claim 1, wherein minimum finished width of at least one of the first wirings and the second wirings is smaller than a minimum finished size of the contacts.

5. A method of manufacturing a semiconductor device, comprising:
   forming a first interlayer dielectric film on a substrate;
   forming first trenches in the first interlayer dielectric film;
   forming first wirings by embedding a conductive film in the first trenches;
   forming a second interlayer dielectric film on the first interlayer dielectric film and the first wirings;
   forming via holes in the second interlayer dielectric film and connected to the first wirings;
   forming via contacts by embedding a conductive film in the via holes;
   forming a third interlayer dielectric film on the second dielectric film and the via contacts;
   forming second trenches in the third interlayer dielectric film and connected to the via contacts; and
   forming second wirings by embedding a conductive film in the second trenches, wherein, in a view of the via contacts substantially perpendicular to the substrate, minimum separation between centers of two closest via contacts is at least $\sqrt{2}$ times minimum separation between centers of two adjacent first wirings.

6. The method of manufacturing a semiconductor device according to claim 5, including forming at least one of the first and second wirings with the minimum separation between centers of two adjacent first wirings smaller than 150 nm.

7. The method of manufacturing a semiconductor device according to claim 5, including forming the via contacts with a size larger than minimum width of at least one of the first wirings and the second wirings.

8. A method of manufacturing a semiconductor device, comprising:
   forming a first interlayer dielectric film on a substrate;
   forming first trenches in the first interlayer dielectric film;
   forming first wirings by embedding a conductive film in the first trenches;
   forming a second interlayer dielectric film on the first interlayer dielectric film and the first wirings;
   forming second trenches in the second interlayer dielectric film;
   forming via holes in the second interlayer dielectric film located under the second trenches and connected to the first wirings; and forming via contacts and second wirings by embedding a conductive film in the via holes and the second trenches, wherein, in a view of the via contacts substantially perpendicular to the substrate, minimum separation between centers of two closest via contacts is at least $\sqrt{2}$ times minimum separation between centers of two adjacent first wirings.

9. The method of manufacturing a semiconductor device according to claim 8, including forming at least one of the first and second wirings with the minimum separation between centers of two adjacent first wirings smaller than 150 nm.

10. The method of manufacturing a semiconductor device according to claim 8, wherein the via contacts have a size larger than minimum width of one of the first wirings and the second wirings.

11. The semiconductor device according to claim 1, wherein the contacts have the minimum separation between centers of two adjacent via contacts to improve via processing margin.

12. The semiconductor device according to claim 1, wherein
the plurality of first wirings comprises a plurality of rows of first wiring segments, the rows of first wiring segments being substantially parallel to each other and uniformly spaced,
the plurality of second wirings comprises a plurality of rows of second wiring segments, the rows of second wiring segments being substantially parallel to each other and uniformly spaced, the first and second wiring segments being co-linear within each row, and
the contacts in adjacent rows are not aligned along a direction transverse to adjacent rows of the first and second wiring segments.

13. The method of manufacturing a semiconductor according to claim 5, including:
forming the first trenches and the first wirings as a plurality of rows of first trench segments and first wiring segments, the rows of first wiring segments being substantially parallel to each other and uniformly spaced;
forming the second trenches and the second wirings as a plurality of rows of second trench segments and second wiring segments, the rows of second wiring segments being substantially parallel to each other and uniformly spaced, the first and second wiring segments being co-linear within each row; and
forming the via holes and via contacts so that the via contacts in adjacent rows are not aligned along a line transverse to adjacent rows of the first and second wiring segments.

14. The method of manufacturing a semiconductor according to claim 8, including:
forming the first wenches and the first wirings as a plurality of rows of first trench segments and first wiring segments, the rows of first wiring segments being substantially parallel to each other and uniformly spaced;
forming the second trenches and the second wirings as a plurality of rows of second trench segments and second wiring segments, the rows of second wiring segments being substantially parallel to each other and uniformly spaced, the first and second wiring segments being co-linear within each row; and
forming the via holes and via contacts so that the via contacts in adjacent rows are not aligned along a line transverse to adjacent rows of the first and second wiring segments.

* * * * *